Figure 1:
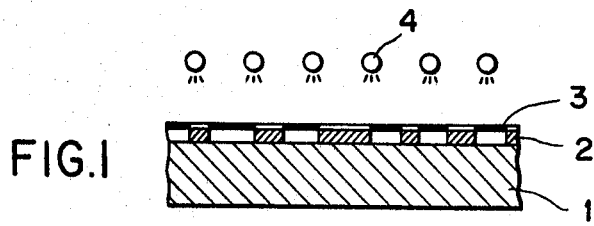

United States Patent [19]

Nakamura et al.

[11] Patent Number: 4,468,453
[45] Date of Patent: Aug. 28, 1984

[54] DRY PROCESS FOR FORMING AN IMAGE

[75] Inventors: Shohei Nakamura, Fuji; Nobuyasu Kinoshita, Tokyo, both of Japan

[73] Assignee: Asahi Kasei Kogyo Kabushiki Kaisha, Osaka, Japan

[21] Appl. No.: 511,042

[22] Filed: Jul. 5, 1983

[30] Foreign Application Priority Data

Jul. 6, 1982 [JP] Japan .............................. 57-117403

[51] Int. Cl.³ .............................................. G03C 5/00
[52] U.S. Cl. .................................... 430/269; 430/270; 430/281; 430/286; 430/291; 430/322; 430/325; 430/326; 430/310
[58] Field of Search .............. 430/269, 270, 281, 286, 430/291, 300, 302, 322, 325, 326, 310

[56] References Cited

U.S. PATENT DOCUMENTS

| | | | |
|---|---|---|---|
| 3,677,756 | 7/1972 | Protzman | 430/291 |
| 4,137,081 | 1/1979 | Pohl | 430/286 |
| 4,173,673 | 11/1979 | Bratt et al. | 430/269 |
| 4,175,964 | 11/1979 | Uchida et al. | 430/286 |
| 4,241,165 | 12/1980 | Hughes et al. | 430/196 |

Primary Examiner—Jack P. Brammer
Attorney, Agent, or Firm—Sprung Horn Kramer & Woods

[57] ABSTRACT

The actinic radiation-exposed or unexposed areas, whichever are relatively low in abrasion resistance, formed in a photosensitive composition layer superimposed on a substrate are selectively removed by blowing an abrasive material against the layer, thereby to obtain a desired image in the layer. By utilizing an article body intended for engraving a pattern as the substrate and by further blowing an abrasive material against the article body until the article body comes to have a pattern of desired depth, a pattern-engraved article can be advantageously produced. The above processes are extremely advantageous over the prior art because any solvent is not needed for the development so that the treatment of the waste solvent and the drying step can be eliminated and because a pattern-engraved article can be produced by the dry process in which the number of necessary steps is reduced.

12 Claims, 5 Drawing Figures

DRY PROCESS FOR FORMING AN IMAGE

This invention relates to a dry process for forming an image. More particularly, this invention is concerned with a dry process for forming an image, in which a solid photosensitive composition layer superimposed on a substrate is exposed to actinic radiation through an image-bearing transparency and, subsequently, the exposed or unexposed areas of the photosensitive composition layer are selectively removed by blowing an abrasive material to form an image, without employing the conventional washing technique utilizing a developing agent such as aqueous and organic solvents. The present invention is also concerned with a method of producing an image-engraved article, in which, through the abovementioned layer having the exposed or unexposed areas selectively removed, an abrasive material is blown against an article body to engrave a pattern corresponding to the image of the image-bearing transparency on the article body.

Techniques utilizing photosensitive resins and compositions are now widespread among the industries manufacturing printing plates, sandblast masks, printed circuit boards and other sophisticated products. According to such techniques, usually, a photopolymerizable or photodegradable composition layer is superimposed on a substrate and exposed through an image-bearing transparency to actinic radiation, and then the unexposed (in the case of a photopolymerizable composition) or exposed (in the case of a photodegradable composition) areas of the layer are washed away with an appropriate solvent and dried to produce a pattern corresponding to the image of the image-bearing transparency. The resulting layer having the pattern is useful as a resist layer for sandblasting various articles or for conducting the etching or sandblasting treatment in the manufacturing of printed circuit boards. However, these conventional techniques cost much labor and require costly additional treatment, for example, treatment of the waste solvent. In particular, the treatment of the waste containing acids and metal salts discharged by the etching treatment has been a serious burden in the industry manufacturing printed circuit boards.

To resolve the above drawbacks of the conventional techniques, the present inventors have made intensive research and, as a result, have found that the disadvantageous step of development utilizing a solvent can be eliminated by applying a novel developing method which takes advantage of the difference in abrasion resistance between the exposed areas and unexposed areas of a photosensitive composition. The term "abrasion resistance" as used herein means the resistance to the destructive force exerted by the blowing of an abrasive material. Illustratively stated, the present inventors have found that the development of a specific photosensitive composition layer can be attained by blowing an abrasive material against the photosensitive composition layer upon exposure, thereby selectively removing the exposed or unexposed areas of the layer whichever is relatively low in abrasion resistance. Based on this novel finding, the present inventors have completed this invention.

It is, therefore, an object of the present invention to provide a dry process for forming an image and, subsequently, producing an image-engraved article which is free from the drawbacks of the conventional processes caused by the use of a solvent for development.

Figure 2:
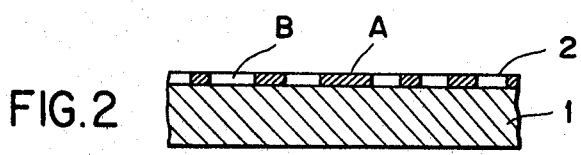
Figure 3:
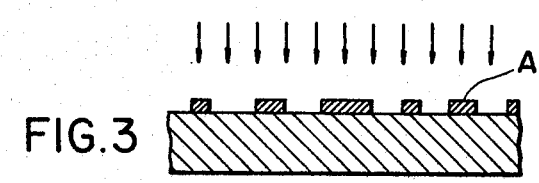
Figure 4:
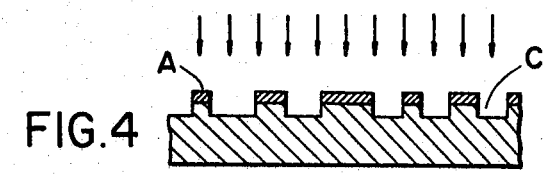
Figure 5:

The foregoing and other objects, features and advantages of the present invention will be apparent to those skilled in the art from the following detailed description and appended claims taken in connection with the accompanying drawing in which: FIGS. 1 to 5 illustrate the steps of the dry process for forming an image and, subsequently, producing an image-engraved article according to the present invention. Further explanation of FIGS. 1 to 5 will be given later.

In one and primary aspect of the present invention, there in provided a dry process for forming an image, which comprises the steps of: (1) exposing through an image-bearing transparency a photosensitive composition layer superimposed on the surface of a substrate, said layer being solid at a temperature of 50° C. or less, to actinic radiation to form exposed areas and unexposed ereas in the layer, said exposed areas and said unexposed areas having a difference in abrasion resistance therebetween which difference is sufficient to allow the exposed areas or unexposed areas to be selectively removed by an abrasive force; and (2) blowing an abrasive material against the layer to selectively remove the exposed areas or the unexposed areas, whichever is relatively low in abrasion resistance, thereby forming an image corresponding to that of the image-bearing transparency in the layer.

In the process of the present invention, the photosensitive composition layer, after exposure thereof, is developed without using any solvent. Hence, the drying step after development is not needed in the process of the present invention. Further, in the process, the laborious treatment of the waste solvent is also not needed. Therefore, the present invention ensures a streamlining of the procedures required to form an image over the prior art.

The photosensitive composition to be employed according to the process of the present invention is solid at a temperature of 50° C. or less and has such a property that upon image-wise exposure to actinic radiation, there are formed, in the composition, exposed areas and unexposed areas which have a difference in abrasion resistance therebetween. The meaning of the term "abrasion resistance" as used herein has already been explained earlier. The present inventors have found that the abrasion resistance of the photosensitive composition depends on the elongation and hardness thereof, and that the suitable parameter for expressing the abrasion resistance is $E^2/HA$ in which E represents a tensile elongation at break as measured by pulling a specimen of 1 mm in thickness at a rate of 500 mm/min in an atmosphere at 20° C. (Japanese Industrial Standard K6301) and HA represents a Shore hardness as measured at 20° C. using a Shore 'A' durometer with respect to a stack of six 1 mm-thick specimens, said hardness being a reading at 15 seconds after pressure application.

The greater the abrasion resistance, namely, the greater the value of $E^2/HA$, the longer the time required to destroy the areas by blowing an abrasive material thereagainst. For example, the time required to destroy a 0.3 mm-thick layer having an $E^2/HA$ value of 500 or less by blowing a #80 alundum under a pneumatic pressure of 5 Kg/cm$^2$ is less than 10 seconds while that required to destroy a layer having an $E^2/HA$ value of 1000 or more is more than 20 seconds. As a result of further investigation, it has been found that generally, the process of the present invention can advantageously be achieved where the exposed areas or unexposed areas have an abrasion resistance of at least 1000 in terms of $E^2/HA$ value while the other areas have an abrasion resistance of 500 or less in terms of $E^2/HA$ value. Where the $E^2/HA$ values of both of the exposed areas and unexposed areas are less than 1000, both the areas are instantaneously removed upon the blowing of the abrasive material, and, therefore, it is impossible to remove selectively the exposed areas or the unexposed areas, whichever is relatively low in abrasion resistance. On the other hand, where the $E^2/HA$ values of both of the exposed areas and unexposed areas are of 1000 or more and where the difference between them is 100% or more based on the $E^2/HA$ value of the area having a relatively low abrasion resistance, a pattern can be obtained by blowing an abrasive material. In this case, however, it takes disadvantageously a prolonged period of time to attain the development. Where the difference between the $E^2/HA$ value of the exposed areas and that of the unexposed areas is less than 100% based on the $E^2/HA$ value of the area having a relatively low abrasion resistance, a clear pattern cannot be obtained. Therefore, in the process of the present invention, there may advantageously be used either of two kinds of photosensitive compositions, i.e. a photosensitive composition capable of forming exposed areas having an abrasion resistance of at least 1000 in terms of $E^2/HA$ value and unexposed areas having an abrasion resistance of 500 or less in terms of $E^2/HA$ value and a one capable of forming exposed areas having an abrasion resistance of 500 or less in terms of $E^2/HA$ value and unexposed areas having an abrasion resistance of at least 1000 in terms of $E^2/HA$ value.

As the suitable photosensitive composition capable of forming exposed areas having an abrasion resistance of at least 1000 in terms of $E^2/HA$ value and unexposed areas having an abrasion resistance of 500 or less in terms of $E^2/HA$ value, there can be mentioned, for example, a phototoughening composition comprising as component (a) at least one polymer selected from the group consisting of homopolymers of a conjugated diene monomer, copolymers of a conjugared diene monomer and a monoene monomer, said homopolymers and copolymers having a number average molecular weight of 100,000 to 1,000,000, and block copolymers of the formula:

(A-B)n-Am wherein A represents a thermoplastic nonelastomeric polymer block having a glass transition temperature of 25° C. or more and having a number average molecular weight of 2,000 to 120,000, B represents an elastomeric polymer block having a glass transition temperature of 10° C. or less and having a number average molecular weight of 25,000 to 1,000,000, n is an integer of from 1 to 10 and m is 0 or 1, as a component (b) at least one ethylenically unsaturated compound and as a component (c) at least one photopolymerization initiator;

the weight proportion of the component (a) relative to the total of the components (a), (b) and (c) being 30 to 98%, the weight proportion of the component (b) relative to the total of the components (a), (b) and (c) being 2 to 70%, and the weight proportion of the component (c) relative to the total of the components (a), (b) and (c) being 0.01 to 10%, provided that when with respect to said block copolymers n is 2 or more or m is 1, the weight proportion of the component (b) relative to the component (a) is 20 to 210%.

The term "phototoughening" as used herein means that the abrasion resistance as defined hereinbefore is increased by the irradiation of light energy.

The number average molecular weights of the polymers appearing in the present specification are those measured according to the customary gel permeation chromatography method using polystyrene as a reference material.

Specific examples of the homopolymers of a conjugated diene monomer to be used as the component (a) of a phototoughening composition to be employed in the present invention are polybutadiene and polyisoprene. Specific examples of the suitable copolymers of a conjugated diene monomer and a monoene monomer are copolymers obtained by copolymerizing a monomer selected from butadiene and isoprene and a monomer selected from styrene, acrylonitrile, acrylates and methacrylates. With respect to the block copolymers of the formula (A-B)n-Am, preferred examples of the suitable block A are polystyrene, polyvinyltoluene and poly(α-methylstyrene). Preferred examples of the suitable block B are polybutadiene, polyisoprene and hydrogenated products thereof. As specific examples of the suitable block copolymers of the formula (A-B)n-Am to be used as the component (a) of a phototoughening composition to be employed in the present invention, there can be mentioned polystyrene-polybutadiene, polystyrene-polyisoprene, poly(α-methylstyrene)-polybutadiene, poly(α-methylstyrene)-polyisoprene, polystyrene-polybutadiene-polystyrene, polystyrene-polyisoprene-polystyrene, polystyrene-polybutadiene-polystyrene-polybutadiene and polyvinyltoluene-polybutadiene-polyvinyltoluene. Of these block copolymers, it is preferred that the content of A blocks be not greater than 90% by weight, more preferably 80% by weight. Block copolymers having a greater content of A blocks than 90% are not suitable because they give phototoughening compositions which, upon exposure, form exposed areas and unexposed areas both having an extremely poor abrasion resistance.

As the suitable ethylenically unsaturated compound to be used as the component (b) of the phototoughening composition to be employed in the present invention, there can be mentioned esters of acrylic acid, methacrylic acid, fumaric acid and maleic acid; derivatives of acrylamide and methacrylamide; N-substituted maleimide; allyl esters and triallyl cyanurate; styrene and derivatives thereof; and the like. Specific examples of the ethylenically unsaturated compounds include ethylene glycol diacrylate, ethylene glycol dimethacrylate, diethylene glycol diacrylate, diethylene glycol dimethacrylate, propylene glycol diacrylate, propylene glycol dimethacrylate, dipropylene glycol diacrylate, dipropylene glycol dimethacrylate, butylene glycol diacrylate, butylene glycol dimethacrylate, polyethylene glycol diacrylate (number average molecular weight: up to 1,500), polyethylene glycol dimethacrylate (number average molecular weight: up to 1,500), polypropylene glycol diacrylate (number average molecular weight: up to 1,500), polypropylene glycol dimethacrylate (number average molecular weight: up to 1,500), trimethylolpropane triacrylate, trimethylolpropane trimethacrylate, pentaerythritol tetraacrylate, pentaerythritol tetramethacrylate, N,N'-hexamethylene-bis-acrylamide, N,N'-hexamethylene-bismethacrylamide, diacetone acrylamide, diacetone methacrylamide, styrene, vinyltoluene, divinylbenzene, diallyl phthalate, triallyl cyanurate, diethyl fumarate, dibutyl fumarate, dioctyl fumarate, didecyl fumarate, dilauryl fumarate, distearyl fumarate, butyl octyl fumarate, lauryl stearyl fumarate, phenyl fumarate, diphenyl fumarate, ditolyl fumarate, bis(ethylphenyl) fumarate, bis(dimethylphenyl) fumarate, bis(hexylphenyl) fumarate, dinaphthyl fumarate, bis(methylnaphthyl) fumarate, dibenzyl fumarate, bis(3-phenylpropyl) fumarate, bis(6-phenylhexyl) fumarate, bis(2-phenylethyl) fumarate, dibutyl maleate, dioctyl maleate, didecyl maleate, diphenyl maleate, ditolyl maleate, dilauryl maleate, distearyl maleate, dibenzyl maleate and bis(6-phenylhexyl) maleate, N-ethyl maleimide, N-hexyl maleimide, N-decyl maleimide, N-lauryl maleimide, N-phenyl maleimide, N-benzyl maleimide, N-N'-hexamethylenebis-maleimide and N,N'-phenylene-bis-maleimide. They may be used either alone or in combination.

When the block copolymer to be used as the component (a) is a copolymer of n=2 or more or m=1, it is preferable to employ an unsaturated compound selected from polyethylene glycol diacrylates and polyethylene glycol dimethacrylates, such as diethylene glycol dimethacrylate, as the component (b) because these compounds have plasticizing capacity for the A blocks. A plasticizer may be added to the phototoughening composition to be employed in the present invention in order to decrease the abrasion resistance of the unexposed areas of the composition. As the suitable plasticizer to be used for the above-mentioned purpose, there can be mentioned, for example, polystyrene, petroleum resin, poly(α-methylstyrene), polyvinyltoluene, polyterpene resin and naphthenic oil.

As the suitable photopolymerization initiator to be used as the component (c) of the phototoughening composition to be employed in the present invention, there can be mentioned, for example, benzophenone, Michler's ketone, benzoin, benzoin methyl ether, benzoin ethyl ether, benzoin isopropyl ether, benzoin isobutyl ether, α-methylolbenzoin, α-methylolbenzoin methyl ether, α-methoxybenzoin ethyl ether, benzoin phenyl ether, α-tert-butyl-benzoin, 2,2-dimethoxy-2-phenylacetophenone, 2,2-diethoxy-2-phenylacetophenone, 2,2-diethoxyacetophenone, benzil, pivaloin, anthraquinone, benzanthraquinone, 2-ethylanthraquinone and 2-chloroanthraquinone. They may be used either alone or in combination.

The photopolymerization initiator may be added in an effective amount for polymerization, i.e., 0.01 to 10% by weight, preferably 0.1 to 3% by weight, based on the phototoughening composition. When the amount is smaller than the range, sufficient effect by photo-initiation cannot be obtained. On the other hand, even if the amount is larger than the range, the obtainable effect does not become so great, but in some cases the resulting layer may be accompanied by deterioration of physical properties.

As the suitable photosensitive composition capable of forming exposed areas having an abrasion resistance of 500 or less in terms of $E^2/HA$ value and unexposed areas having an abrasion resistance of at least 1000 in terms of $E^2/HA$ value, there can be mentioned, for example, a photodeteriorating composition comprising as a component (a') at least one polymer selected from the group consisting of crystalline 1,2-addition polybutadienes having a crystallinity of from 10 to 30% (as measured according to the customary infrared spectrum method) and having a number average molecular weight of 70,000 to 500,000 and block copolymers of the formula:

$$(A-B)_{n'}-A_{m'}$$

wherein A represents a thermoplastic nonelastomeric polymer block having a glass transition temperature of 25° C. or more and having a number average molecular weight of 2000 to 120,000, B represents an elastomeric polymer block having a glass transition temperature of 10° C. or less and having a number average molecular weight of 25,000 to 1,000,000, n' is an integer of from 1 to 10, m' is 1 when n' is 1 and m' is 0 or 1 when n' is an integer of from 2 to 10, as a component (b') at least one ethylenically unsaturated compound, as a component (c') at least one photopolymerization initiator and as a component (d') at least one ethylenically unsaturated group-containing liquid rubber having a number average molecular weight of from 1000 to 6000;

the weight proportion of the component (a') relative to the total of the components (a'), (b'), (c') and (d') being 25 to 96%, the weight proportion of the component (b') relative to the total of the components (a'), (b'), (c') and (d') being 2 to 40%, the weight proportion of the component (c') relative to the total of the components (a'), (b'), (c') and (d') being 0.01 to 10%, and the weight proportion (d') relative to the total of the components (a'), (b'), (c') and (d') being 2 to 49%.

The term "photodeteriorating" as used herein means that the abrasion resistance as defined hereinbefore is decreased by the irradiation of light energy.

Specific examples of the suitable polymer blocks represented by A and B of the block copolymer to be used as the component (a') as well as specific examples of the suitable ethylenically unsaturated compound and photopolymerization initiator to be used as the component (b') and component (c'), respectively, are the same as those cited hereinbefore with respect to the phototoughening composition.

As the suitable ethylenically unsaturated group-containing liquid rubber to be used as the component (d') of the photodeteriorating composition to be employed in the present invention, there can be mentioned, for example, such liquid rubbers as obtained by reacting a starting liquid rubber having at one end or by ends of the main chain thereof a functional group, such as hydroxyl group, epoxy group and carboxyl group, with a compound selected from ethylenically unsaturated carboxylic acids such as methacrylic acid, acrylic acid, maleic anhydride and fumaric acid; compounds having a hydroxyl group together with an ethylenically unsaturated group such as 2-hydroxyethyl (meth)acrylate, 2-hydroxypropyl (meth)acrylate and polypropylene glycol mono(meth)acrylate; and glycidyl methacrylate: or by modifying either of the above reactants with a diisocyanate compound followed by the reaction of the isocyanate group-containing rubber or compound with the rest of the reactants.

The purpose of incorporating the foregoing ethylenically unsaturated group-containing liquid rubber is to obtain a photodeteriorating composition which gives, upon image-wise exposure, exposed areas having an abrasion resistance of 500 or less in terms of $E^2/HA$ value. The ethylenically unsaturated group-containing liquid rubber is preferably incorporated in an amount of from 2 to 100 parts by weight per 100 parts by weight of the component (a') polymer. When the incorporated amount of the liquid rubber is smaller than the above lower limit, the above-mentioned purpose cannot be sufficiently attained. On the other hand, when the incorporated amount of the liquid rubber is greater than the above upper limit, the abrasion resistance of the unexposed areas also disadvantageously decreases.

In addition, to the photosensitive, either phototoughening or photodeteriorating, composition to be used in the present invention, a thermal polymerization inhibitor or stabilizer may be added to improve the storage stability of the photosensitive composition. The thermal polymerization inhibitor or stabilizer may be added in an amount of from 0.001 to 2% by weight relative to the photosensitive composition.

As the suitable thermal polymerization inhibitor or stabilizer, there can be mentioned, for example, 2,6-di-tertbutyl-p-cresol, p-methoxyphenol, pentaerythritol tetrakis hydroquinone, tert-butylcatechol, tert-butylhydroxyanisole and 4,4'-butylidenebis(3-methyl-6-tert-butyl)phenol.

The ratio of the polymer content to that of the ethylenically unsaturated compound, i.e. (a)/(b) with respect to the above-described typical phototoughening composition and (a')/(b') with respect to the above-described typical photodeteriorating composition, may widely vary according to the kinds of the polymer and ethylenically unsaturated compound. It is preferred that the ratio be determined so as to increase the difference in abrasion resistance between the exposed areas and unexposed areas in the ultimate photosensitive composition. Further, as described before, the process of the present invention is useful to produce an image-engraved article. To engrave a pattern having an increased depth, the blowing of the abrasive material must be continued for a prolonged period of time. Hence, the protective areas of the imagebearing layer after exposure and dry development must have a sufficient abrasion resistance. It is requisite that the kinds and mixing ratio of the components of the photosensitive composition to be employed in the process of the present invention be determined so as to allow the protective areas of the image-bearing layer to have an abrasion resistance sufficient to resist the blowing of the abrasive material, that is, at least 1000 in terms of $E^2/HA$ value.

The photosensitive composition to be employed in the present invention must be solid at a temperature of 50° C. or less; in other words, it must be solid at least at a temperature at which an abrasive material is blown against the photosensitive composition layer. The blowing of the abrasive material is usually conducted at a temperature of from 0° to 35° C. In the case where the photosensitive composition is liquid, the abrasive material adheres to the unhardened areas of the composition to form an agglomerate. The agglomerate cannot be efficiently removed so that it becomes impossible to engrave a clear pattern on the substrate.

In the process of the present invention, the suitable photosensitive composition is superimposed on the surface of a substrate. As the suitable substrate, there can be mentioned, for example, films and sheets of metals such as aluminum and copper, plastic materials such as phenol resins, polyesters and polyolefins, ceramics such as glass, alumina and silica, silicon, a stone and a wood.

The suitable photosensitive composition can be superimposed, in the form of a layer, on the substrate according to customary procedures. For example, the suitable photosensitive composition as cited hereinbefore is dissolved in an appropriate solvent, such as toluene, hexane, 1,1,1-trichloroethane, perclene, chloroform and tetrahydrofuran, to prepare a solution. Then, the solution is either sprayed by means of a spraying device or coated by means of a bar coater, roll coater, spin coater or gravure coater on a substrate, and dried to obtain the solid photosensitive composition layer superimposed on the substrate. In another way, the above-mentioned solution is sprayed or coated on a polymeric film support, such as polyester film and polypropyrene film, and dried to obtain the solid photosensitive composition layer superimposed on the film support. The resulting element is subsequently superimposed on a substrate intended for engraving, having the surface of the photosensitive composition layer remote from the support in contact with the substrate, by taking advantage of the adherence of the layer or using an adhesive. Thereafter, the film support is stripped off to obtain the solid photosensitive composition layer superimposed on the substrate. In the latter method, it is advantageous to use, in place of the above-cited film support, a composite film support consisting of a base film, such as polyester film and polypropyrene film and, superimposed thereon, a transparent cover film having poor adherence to the base film but good adherence to the solid photosensitive composition and adapted to be destroyed by sand blasting. The above-mentioned cover film has preferably a thickness of from 0.5 to 10 microns, and consists, for example, of at least one polymer selected from cellulose derivatives such as alkylcelluloses, cellulose acetate butylate and cellulose acetate phthalate, polyvinyl alcohol and polymethyl methacrylate. The suitable photosensitive composition solution is sprayed or coated on a composite film support, cover side up, and dried. The resulting element is subsequently superimposed on a substrate intended for engraving, having the surface of the photosensitive composition layer remote from the support in contact with the substrate. Thereafter, the base film is stripped off to obtain an element consisting of the substrate and, superimposed thereon in the following order, the photosensitive composition layer and the cover film. The use of the cover film is advantageous because it facilitates the intimate mounting of an image-bearing transparency, viz. negative or positive photographic film, on the photosensitive composition layer and also facilitates the stripping of the base film as support. When a solid, but still sticky, photosensitive composition is employed, the use of the cover film is especially useful from the viewpoints of the intimate mounting of a negative or positive photographic film and the ready stripping of the support. On the other hand, in the case of a solid, but still sticky, photosensitive composition, it is also advantageous to laminate a transparent protective film such as polyester film or polypropylene film, having a thickness of from 8 to 30 microns, on the composition as compared to the direct mounting of a negative or positive on the composition, because the protective film prevents the disadvantageous adherence between the negative or positive and the composition. In a further way, the photosensitive composition may be molded into a sheet by means of a heat press. The sheet may then be laminated on the substrate, taking advantage of the adhering property of the composition or using an adhesive to obtain the solid photosensitive composition layer superimposed on the substrate.

According to the process of the present invention, a solid photosensitive composition layer superimposed on the surface of a substrate is exposed to actinic radiation. Then, the exposed or unexposed areas of the layer, whichever is relatively low in abrasion resistance, are selectively removed by blowing an abrasive material against the layer. According to the above process, it is possible to prepare a printing plate by stopping the blowing of the abrasive material at an appropriate time before the complete removal of the exposed or unexposed areas.

In the process of the present invention, the photosensitive composition layer is exposed to actinic radiation. As the suitable source of actinic radiation, there can be mentioned, for example, a low pressure mercury lamp, a high pressure mercury lamp, an ultraviolet fluorescent lamp, a carbon arc lamp, a xenon lamp, a zirconium lamp and sun light.

After the exposure, an abrasive material is blown against the resulting photosensitive composition layer in the process of the present invention. As the suitable abrasive material, there can be mentioned, for example, a natural abrasive material selected from the group consisting of diamond, alundum, corundum, emery, garnet, feldspar, calcinated white sand, silica and sand or a synthetic abrasive material selected from the group consisting of silicon carbide, aluminum oxide, titanium carbide, boron carbide, titanium nitride and glass beads. It is preferred that the particle size of the abrasive material be in the range of from $20\mu$ to 1 mm, more preferably from $40\mu$ to 0.5 mm.

In the process of the present invention, the development is carried out by blowing an abrasive material against the photosensitive composition layer exposed to actinic radiation. Illustratively stated, during this step, the abrasive material entrained by air or other suitable gas is blown under a pressure of about 1 to 10 $Kg/cm^2$ by means of a customary sandblaster having, preferably, a plurality of nozzles, a customary spray gun or the like. It is preferred that both the nozzle or nozzles and the element consisting of the exposed photosensitive composition and the substrate be continuously moved in the same or mutually opposite direction during the blowing to obtain a uniformly engraved product.

The period of time necessary for the development depends on the kind of the photosensitive composition, the thickness of the photosensitive composition layer and the kind, particle size and blowing pressure of the abrasive material. However, it generally takes about several seconds to several minutes per $cm^2$ of the layer to complete the development.

As aforementioned, the process of the present invention is useful for engraving a pattern on an article body to produce an image-engraved article. An article body intended for engraving a pattern thereon can be used as the abovedescribed substrate. The use of an article body as the substrate is advantageous because an image-engraved article can be directly produced by continuing the blowing of the abrasive material after the development of the exposed photosensitive composition layer. Accordingly, in another aspect of the present invention, there is provided a method of producing an image-engraved article which comprises the steps of:

(1) exposing through an image-bearing transparency a photosensitive composition layer superimposed on the surface of an article body, said layer being solid at a temperature of 50° C. or less, to actinic radiation to form exposed areas and unexposed areas in the layer, said exposed areas and said unexposed areas having a difference in abrasion resistance therebetween which difference is sufficient to allow the exposed areas or unexposed areas to be selectively removed by an abrasive force;

(2) blowing an abrasive material against the layer to selectively remove the exposed areas or the unexposed areas, whichever is relatively low in abrasion resistance, thereby forming an image corresponding to that of the image-bearing transparency on the layer; and (3) further blowing an abrasive material through the removed areas of the layer against the article body to engrave an image corresponding to that of the image-bearing transparency on the article body.

In the above method, the kinds of the abrasive materials to be used in the steps (2) and (3) may be the same or different.

This method for forming an image-engraved material is extremely advantageous as compared with the conventional technique in which after exposure of the photosensitive composition layer, it is requisite to carry out development with a solvent, followed by drying, stripping a support film or the like, mounting on a substrate and blowing an abrasive material. Further, this method can be advantageously utilized for the production of printed circuit boards as compared to the conventional method in which after the formation of a mask pattern on a copper-clad laminated board, etching has to be conducted with chemicals.

The above-mentioned continued blowing of the abrasive material is generally advantageous. However, according to need, the resist layer, i.e. the layer obtained by exposing the photosensitive composition layer to actinic radiation and removing the exposed or unexposed areas by blowing the abrasive material, may be separated from the substrate and laminated on an article body. Then, the blowing of the abrasive material may be resumed through the removed areas of the resist layer to obtain an image-engraved article. Accordingly, in a further aspect of the present invention, there is provided a method of producing an image-engraved article which comprises the steps of:

(1) exposing through an image-bearing transparency a photosensitive composition layer superimposed on the surface of a substrate, said layer being solid at a temperature of 50° C. or less, to actinic radiation to form exposed areas and unexposed areas in the layer, said exposed areas and said unexposed areas having a difference in abrasion resistance therebetween which difference is sufficient to allow the exposed areas or unexposed areas to be selectively removed by an abrasive force;

(2) blowing an abrasive material against the layer to selectively remove the exposed areas or the unexposed areas, whichever is relatively low in abrasion resistance, thereby forming an image corresponding to that of the image-bearing transparency on the layer;

(3) stripping the layer having the image thereon from the substrate;

(4) superimposing the layer on an article body; and (5) blowing an abrasive material through the removed areas of the layer against the article body to engrave an image corresponding to that of the image-bearing transparency on the article body.

In the above method, the kinds of the abrasive materials to be used in the steps (2) and (5) may be the same or different.

By employing a copper-clad laminated board as the substrate, there is provided a dry process for the production of a printed circuit board. As is apparent from the foregoing, the present invention provides a streamlined process for manufacturing, for example and not limited thereto, a printed circuit board, through-hole base, relief printing plate and decorative material.

The kind of the article body to be used in the present invention is not critical. It includes, for example, those cited hereinbefore with respect to the substrate to be used in the present invention. Incidentally, the abrasion resistances of the article bodies made of the materials mentioned above are generally small as compared to those of the areas of the photosensitive composition layer to be removed by the blowing of the abrasive material. Hence, the article bodies can be readily engraved by the blowing of the abrasive material in the method of the present invention. The shape of the article body is also not critical. For example, the article body may be a rectangular parallelpiped for use as a decorative plate, tombstone, pane or printed circuit board, a sphere for use as a bowling ball or a cube for use as a die or brick.

The period of time of the blowing of an abrasive material to engrave the intended pattern after the development of the exposed photosensitive composition layer depends on the kind, particle size and blowing pressure of the abrasive material as well as the kind of the article body as substrate, the depth of the engraved pattern and the like. However, it generally takes about several seconds to several minutes per cm$^2$ of the layer to complete the blowing.

Referring now to FIGS. 1 to 5 one mode of the process of the present invention is explained below. The element consisting of a substrate or article body 1 and, superimposed thereon in the following order, a phototoughening composition layer 2 and an image-bearing transparency 3 is laid, transparency side up, and exposed to actinic radiation from the source of light 4 placed above the element [see FIG. 1]. Thereby, the exposed areas A of the layer 2 become tough, while the unexposed areas B remain unchanged. Then, the transparency 3 is stripped off and an abrasive material is blown against the entire surface of the layer 2 [see FIG. 2]. By blowing the abrasive material, the unexposed areas B of the layer 2 are removed while the exposed areas A of the layer 2 remains, thereby forming a pattern corresponding to the image of the image-bearing transparency [see FIG. 3]. Further, the blowing of the abrasive material is continued to engrave the pattern on the substrate to the desired depth C [see FIG. 4]. Finally, the exposed areas A of the layer 2 which are remaining on the substrate are removed [see FIG. 5].

The present invention will be illustrated in more detail with reference to the following Examples, which should not be construed to be limiting the scope of the present invention.

EXAMPLE 1

90 g of a polystyrene-polybutadiene block copolymer (styrene content: 25% by mole, number average molecular weight: 200,000), 3 g of N-laurylmaleimide, 2 g of dioctyl fumarate, 6 g of a liquid polybutadiene (number average molecular weight: 2000), 2 g of 2,2- dimethoxyphenylacetophenone and 0.1 g of 2,6-di-tert-butyl-p-cresol were dissolved in 500 g of chloroform as a solvent to obtain a solution. The resulting solution was then subjected to removal of the solvent under reduced pressure, thereby obtaining a solid phototoughening composition. The thus obtained solid, soft phototoughening composition was interposed between two pieces of a 100 μm-thick polyethylene terephthalate film, and molded into a composite sheet, using a 0.2 mm-thick spacer, by means of a press heated at 150° C.

Subsequently, one of the two pieces of polyethylene terephthalate film was stripped from the phototoughening composition layer, and, instead, a negative photographic film bearing a predetermined image was brought into contact with the phototoughening composition layer. The phototoughening composition layer was then exposed, through the negative photographic film, to actinic radiation of 2 mW/cm$^2$ in intensity from an ultraviolet fluorescent lamp for one minute to form exposed phototoughened areas and unexposed non-phototoughened areas in the phototoughening composition layer. After the exposure to actinic radiation, the negative photographic film was removed, and an alundum having an average grain size of 180 microns was blown against the layer having the exposed phototoughened areas and unexposed non-phototoughened areas by means of a siphon-type sandblaster manufactured and sold by Fuji Seisakusho Co., Japan under a pneumatic pressure of 5 kg/cm$^2$. By this treatment, the unexposed non-phototoughened areas were removed so that a pattern corresponding to the image of the negative photographic film was formed in the layer.

Incidentally, with respect to the phototoughenning composition layer, test specimens were prepared for the measurements of the tensile elongation at break (E) and of the Shore A hardness (HA). As a result of the measurements and a simple calculation, the value E$^2$/HA of the phototoughening composition layer was found to be 90. On the other hand, the phototoughening composition layer was exposed under the same conditions as mentioned above, and test specimens for the measurements of the tensile elongation at break (E') and of the Shore A hardness (HA') were prepared therefrom. As a result of the measurements and a simple calculation, the value E'$^2$/HA' of the exposed layer was found to be 3700.

EXAMPLE 2

70 g of a polystyrene-polyisoprene-polystyrene block copolymer (styrene content: 14% by weight, number average molecular weight: 240,000), 30 g of tetraethylene glycol dimethacrylate, 4 g of benzoin isopropyl ether and 0.1 g of p-methoxyphenol were dissolved in 500 g of chloroform to obtain a solution. The resulting solution was poured into a space defined by a 5 mm-thick glass plate and a 0.3 mm-thick spacer placed on said glass plate. The chloroform was then evaporated from the solution, thereby forming a 0.1 mm-thick solid phototoughening composition layer superimposed on the glass plate. A negative photographic film bearing an image was brought into contact with the surface of the phototoughening composition layer. Then, the phototoughening composition layer was exposed, through the negative photographic film, to actinic radiation of 2 mW/cm$^2$ in intensity from an ultraviolet fluorescent lamp for 40 seconds to form exposed phototoughened areas and unexposed non-phototoughened areas in the phototoughening composition layer. After the exposure to actinic radiation, the negative photographic film was removed, and an alundum having an average grain size of 150 microns was blown against the layer having the exposed phototoughened areas and unexposed non-phototoughened areas by means of a siphon-type sandblaster manufactured and sold by Fuji Seisakusho Co., Japan under a pneumatic pressure of 4 Kg/cm$^2$. By this treatment, the unexposed non-phototoughened areas were removed so that a pattern corresponding to the image of the negative photographic film was formed in the layer. The alundum was further blown through the removed areas of the layer against the glass plate to engrave the pattern on the glass plate. When a desirable depth was obtained for the pattern on the glass plate, the blowing of the alundum was discontinued and the layer was stripped from the glass plate. As a result, a glass plate product having a desired image engraved on its surface was obtained.

Incidentally, with respect to the phototoughening composition layer, test specimens were prepared for the measurements of the tensile elongation at break (E) and of the Shore A hardness (HA). As a result of the measurements and a simple calculation, the value E$^2$/HA of the phototoughening composition layer was found to be 230. On the other hand, the phototoughening composition layer was exposed under the same conditions as mentioned above, and test specimens for the measurements of the tensile elongation at break (E') and of the Shore A hardness (HA') were prepared therefrom. As a result of the measurments and a simple calculation, the value E'$^2$/HA' of the exposed layer was found to be 12,000.

EXAMPLE 3

70 g of a crystalline 1,2-polybutadiene (crystallinity: 22%, number average molecular weight: 100,000), 20 g of a liquid 1,2-polybutadiene having both ends thereof modified with methacrylate (TE-2000, Trademark, manufactured and sold by Nippon Soda Co., Ltd., Japan, number average molecular weight: 2600), 10g of dioctyl fumarate, 2 g of benzoin isobutyl ether and 0.1 g of 2,6-di-tert-butyl-p-cresol were dissolved in 500 g of chloroform to obtain a solution. The resulting solution was coated, using a bar coater, on a 5 mm-thick copper-clad laminate, and dried. As a result, there was obtained a solid photodeteriorating composition layer, having a thickness of 40 microns, superimposed on the copper-clad laminate. A positive photographic film having a line width of 500 microns was brought into contact with the surface of the photodeteriorating composition layer. The photodeteriorating composition layer was then exposed, through the positive photographic film, to actinic radiation of 1.8 mW/cm$^2$ in intensity from an ultraviolet fluorescent lamp for 30 minutes to form exposed photodeteriorated areas and unexposed non-photodeteriorated areas in the layer. After the exposure to actinic radiation, the positive photographic film was removed. Subsequently, a caborundum having an average grain size of 100 microns was blown against the layer having the exposed photodeteriorated areas and unexposed non-photodeteriorated areas and then against the copper-clad laminate by means of a siphon-type sandblaster manufactured and sold by Fuji Seisakusho Co., Japan under a pneumatic pressure of 3 Kg/cm$^2$. By this treatment, the exposed photoderiorated areas of the layer and the areas of the copper which had not been protected by the layer were removed. After completion of the blowing, the remaining unexposed non-photodeteriorated areas of the layer were rubbed off with a cloth. As a rusult, there was obtained a printed circuit board having a pattern corresponding to the image of the positive photographic film.

Incidentally, with respect to the photodeteriorating composition layer, test specimens were prepared for the measurements of the tensile elongation at break (E) and of the Shore A hardness (HA). As a result of the measurements and a simple calculation, the value E$^2$/HA of the photodeteriorating composition layer was found to be 2500. On the other hand, the photodeteriorating composition layer was exposed under the same conditions as mentioned above, and test specimens for the measurements of the tensile elongation at break (E') and of the Shore A hardness (HA') were prepared therefrom. As a result of the measurements and a simple calculation, the value E'$^2$/HA' of the exposed layer was found to be 10.

EXAMPLE 4

A composite film consisting of a 2 μm-thick cover film of cellulose acetate butyrate on a 100 μm-thick base film of polyethylene terephthalate was obtained by coating a solution of cellulose acetate butyrate in a 7:3 by volume mixture of ethyl acetate and toluene on the polyethylene terephthalate film by means of a bar coater and drying the solution.

70 g of the same polystyrene-polybutadiene block copolymer as employed in Example 1, 30 g of diethylene glycol dimethacrylate, 2 g of 2,2-dimethoxy-2-phenylacetophenone and 0.2 g of 2,6-di-tert-butyl-p-cresol were dissolved in 500 g of chloroform as a solvent to obtain a solution. From the resulting solution, the solvent was removed by evaporation under reduced pressure, thereby obtaining a solid phototoughening composition. The solid phototoughening composition was placed on the above-obtained composite film, having the cover film of cellulose acetate butyrate in contact with the phototoughening composition, and on the phototoughening composition was disposed a 100 μm-thick protective film of polyethylene terephthalate. Then, molding was performed in the same manner as described in Example 1 to obtain a composite sheet consisting of the protective film and, superimposed thereon in the following order, the phototoughening composition layer, the cover film and the base film. The base film was stripped from the cover film, and a negative photographic film having an image was mounted on the cover film. The negative photographic film and the cover film of the resulting composite sheet were intimately contacted by means of a printing frame under vacuum. The phototoughening composition layer was exposed through the negative photographic film and the cover film to actinic radiation of 2 mW/cm$^2$ in intensity for one minute. Then, the negative film was stripped off. By performing the blowing of the abrasive material in the same manner as described in Example 1, the cover film and the unexposed non-phototoughened areas of the phototoughening composition layer were removed so that a clear image corresponding to that of the negative photographic film was obtained.

REFERENCE EXAMPLE 1

90 g of the same polystyrene-polyisoprene-polystyrene block copolymer as employed in Example 2, 10 g of diethylene glycol dimethacrylate, 10 g of benzoin isopropyl ether and 0.1 g of p-methoxyphenol were dissolved, coated and dried in the same manner as described in Example 2 to obtain a 0.1 mm-thick solid phototoughening composition layer superimposed on a 5 mm-thick glass plate. The image-wise exposure to actinic radiation and the blowing of the abrasive material were performed in the same manner as described in Example 2. Even by the prolonged blowing of the abrasive material for 5 minutes per cm², the unexposed areas were not removed and the intended clear image was hardly obtained on the phototoughening composition layer. The phototoughening composition layer before exposure had an abrasion resistance ($E^2/HA$) of 6500 whereas that after exposure had an abrasion resistance ($E'^2/HA'$) of 58,000.

REFERENCE EXAMPLE 2

70 g of the same crystalline 1,2-polybutadiene, 20 g of liquid 1,2-polybutadiene (B-2000, Trademark, manufactured and sold by Nippon Soda Co., Ltd., Japan, number average molecular weight: 2000), 10 g of dioctyl fumarate, 2 g of benzoin isobutyl ether and 0.1 g of 2,6-di-tert-butyl-p-cresol were dissolved, coated and dried in the same manner as described in Example 3 to obtain a 40 mm-thick solid photodeteriorating layer superimposed on a 5 mm-thick copper-clad laminate. The image-wise exposure to actinic radiation and the blowing of the abrasive material were performed in the same manner as described in Example 3. Even by the prolonged blowing of the abrasive material for 5 minutes per cm², the exposed areas were not removed and the intended clear image was hardly obtained on the photodeteriorating layer.

The photodeteriorating composition layer before exposure had an abrasion resistance ($E^2/HA$) of 15,000 whereas that after exposure had an abrasion resistance ($E'^2/HA'$) of 6000.

What is claimed is:

1. A dry process for forming an image, which comprises the steps of:
   (1) exposing through an image-bearing transparency a photosensitive composition layer superimposed on the surface of a substrate, said layer being solid at a temperature of 50° C. or less, to actinic radiation to form exposed areas and unexposed areas in the layer, said exposed areas and said unexposed areas having a difference in abrasion resistance therebetween which difference is sufficient to allow the exposed areas or unexposed areas to be selectively removed by an abrasive force; and
   (2) blowing an abrasive material against the layer to selectively remove the exposed areas or the unexposed areas, whichever is relatively low in abrasion resistance, thereby forming an image corresponding to that of the image-bearing transparency in the layer.

2. A process according to claim 1, wherein the photosensitive composition layer is a layer of phototoughening composition, and wherein in the step (1), there are formed exposed phototoughened areas and unexposed non-phototoughened areas in the layer, said exposed phototoughened areas having a greater abrasion resistance than the unexposed non-phototoughened areas and in the step (2), the unexposed non-phototoughened areas are selectively removed.

3. A process according to claim 1, wherein the photosensitive composition layer is a layer of photodeteriorating composition, and wherein in the step (1), there are formed exposed photodeteriorated areas and unexposed non-photodeteriorated areas in the layer, said exposed photodeteriorated areas having a smaller abrasion resistance than the unexposed non-photodeteriorated areas and in the step (2), the exposed photodeteriorated areas are selectively removed.

4. A process according to claim 2, wherein the exposed phototoughened areas have an abrasion resistance of at least 1000 while the unexposed non-phototoughened areas have an abrasion resistance of 500 or less, said abrasion resistance being defined as $E^2/HA$ in which E represents a tensile elongation at break as measured by pulling a specimen of 1 mm in thickness at a rate of 500 mm/min in an atmosphere at 20° C. (Japanese Industrial Standard K6301) and HA represents a Shore hardness as measured at 20° C. using a Shore 'A' durometer with respect to a stack of six 1 mm-thick specimens, said hardness being a reading at 15 seconds after pressure application.

5. A process according to claim 3, wherein the unexposed non-photodeteriorated areas have an abrasion resistance of at least 1000 while the exposed photodeteriorated areas have an abrasion resistance of 500 or less, said abrasion resistance being defined as $E^2/HA$ in which E represents a tensile elongation at break as measured by pulling a specimen of 1 mm in thickness at a rate of 500 mm/min in an atmosphere at 20° C. (Japanese Industrial Standard K6301) and HA represents a Shore hardness as measured at 20° C. using a Shore 'A' durometer with respect to a stack of six 1 mm-thick specimens, said hardness being a reading at 15 seconds after pressure application.

6. A process according to claim 1, wherein the substrate is composed of at least one member selected from the group consisting of a metal selected from aluminum and copper, a plastic material selected from phenol resins, polyesters and polyolefins, a material selected from glass, alumina and silica, silicon, a stone and a wood.

7. A process according to claim 2, wherein the phototoughening composition is a composition comprising as a component (a) at least one polymer selected from the group consisting of homopolymers of a conjugated diene monomer, copolymers of a conjugated diene monomer and a monoene monomer, said homopolymers and copolymers having a number average molecular weight of 100,000 to 1,000,000, and block copolymers of the formula:

(A-B)n-Am 

wherein A represents a thermoplastic non-elastomeric polymer block having a glass transition temperature of 25° C. or more and having a number average molecular weight of 2000 to 120,000, B represents an elastomeric polymer block having a glass transition temperature of 10° C. or less and having a number average molecular weight of 25,000 to 1,000,000, n is an integer of from 1 to 10 and m is 0 or 1, as a component (b) at least one ethylenically unsaturated compound and as a component (c) at least one photopolymerization initiator;

the weight proportion of the component (a) relative to the total of the components (a), (b) and (c) being 30 to 98%, the weight proportion of the component (b) relative to the total of the components (a), (b) and (c) being 2 to 70%, and the weight proportion of the component (c) relative to the total of the components (a), (b) and (c) being 0.01 to 10%, provided that when with respect to said block copolymers n is 2 or xore or m is 1, the weight proportion of the component (b) relative to the component (a) is 20 to 210%.

8. A process according to claim 3, wherein the photodeteriorating composition is a composition comprising as a component (a') at least one polymer selected from the group consisting of crystalline 1,2-addition polybutadienes having a crystallinity of from 10 to 30% and having a number average molecular weight of 70,000 to 500,000 and block copolymers of the formula:

(A-B)n'-Am' wherein A represents a thermoplastic non-elastomeric polymer block having a glass transition temperature of 25° C. or more and having a number average molecular weight of 2000 to 120,000, B represents an elastomeric polymer block having a glass transition temperature of 10° C. or less and having a number average molecular weight of 25,000 to 1,000,000, n' is an integer of from 1 to 10, m' is 1 when n' is 1 and m' is 0 or 1 when n' is an integer of from 2 to 10,
as a component (b') at least one ethylenically unsaturated compound, as a component (c') at least one photopolymerization initiator and as a component (d') at least one ethylenically unsaturated group-containing liquid rubber having a number average molecular weight of from 1000 to 6000;
the weight proportion of the component (a') relative to the total of the components (a'), (b'), (c') and (d') being 25 to 96%, the weight proportion of the component (b') relative to the total of the components (a'), (b'), (c') and (d') being 2 to 40%, the weight proportion of the component (c') relative to the total of the components (a'), (b'), (c') and (d') being 0.01 to 10%, and the weight proportion (d') relative to the total of the components (a'), (b'), (c') and (d') being 2 to 49%.

9. A process according to claim 1, wherein the abrasive material is a natural abrasive material selected from the group consisting of diamond, alundum, corundum, emery, garnet, feldspar, calcinated white sand, silica and sand or a synthetic abrasive material selected from the group consisting of silicon carbide, aluminum oxide, titanium carbide, boron carbide, titanium nitride and glass beads.

10. A process according to claim 1, wherein the photosensitive composition layer has a transparent cover film superimposed on the surface of the photosensitive composition layer remote from the substrate, said transparent cover film having moderate to high adherence to the photosensitive composition layer and being adapted to be destroyed by the blowing of the abrasive material.

11. A method for producing an image-engraved article in accordance with the process of claim 1, wherein in the step (1), an article body is used as the substrate and which comprises, following the step (2), further blowing an abrasive material through the removed areas of the layer against the article body to engrave an image corresponding to that of the image-bearing transparency on the article body.

12. A method for producing an image-engraved article in accordance with the process of claim 1, which comprises, following the step (2),
(3) stripping the layer having the image thereon from the substrate;
(4) superimposing the layer on an article body; and
(5) blowing an abrasive material through the removed areas of the layer against the article body to engrave an image corresponding to that of the image-bearing transparency on the article body.

* * * * *

UNITED STATES PATENT AND TRADEMARK OFFICE
CERTIFICATE OF CORRECTION

PATENT NO. : 4,468,453
DATED : August 28, 1984
INVENTOR(S) : Shohei Nakamura et al It is certified that error appears in the above-identified patent and that said Letters Patent is hereby corrected as shown below:

| | |
|---|---|
| Col. 6, line 47 | Delete "by" and substitute --both-- |
| Col. 7, line 18 | Delete "tertbutyl" and substitute --tert-butyl-- |
| Col. 7, line 19 | After "tetrakis" insert --[3-(3',5'-di-tert-butyl-4'-hydroxy)phenyl-propionate],-- |
| Col. 7, line 19 | Correct spelling of --hydroquinone-- |
| Col. 9, lines 30 and 31 | Delete "µ" and substitute --µm-- |
| Col. 11, line 44, Col. 11, line 50 and Col. 11, line 55 | Delete "A" and substitute --$\underline{A}$-- |
| Col. 11, line 45 and Col. 11, line 49 | Delete "B" and substitute --$\underline{B}$-- |
| Col. 11, line 54 | Delete "c" and substitute --$\underline{C}$-- |
| Col. 14, line 21 | After "butyrate" insert --superimposed- |
| Col. 15, line 22 | After "40" delete "mm" and substitute --µm-- |
| Col. 17, line 1 | Delete "xore" and substitute --more-- |

Signed and Sealed this

Nineteenth Day of February 1985

[SEAL]

Attest:

DONALD J. QUIGG

Attesting Officer     Acting Commissioner of Patents and Trademarks